(12) United States Patent
Chen

(10) Patent No.: US 10,691,274 B2
(45) Date of Patent: Jun. 23, 2020

(54) TOUCH SENSOR WITH ENHANCED AND SMALL-SCALE SENSITIVITY AND METHOD FOR MAKING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Yu-Ju Chen, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 16/252,165

(22) Filed: Jan. 18, 2019

(65) Prior Publication Data

US 2020/0133413 A1    Apr. 30, 2020

(30) Foreign Application Priority Data

Oct. 25, 2018    (CN) .......................... 2018 1 1247957

(51) Int. Cl.
*G06F 3/044*    (2006.01)
*H01L 41/08*    (2006.01)

(52) U.S. Cl.
CPC .......... *G06F 3/044* (2013.01); *H01L 41/0825* (2013.01)

(58) Field of Classification Search
CPC ... H01L 25/04; H01L 41/053; H01L 41/0805; H01L 41/0815; H01L 41/25; H01L 41/314; H01L 41/316; H01L 41/317; H01L 41/319; H01L 41/331; H01L 41/193; H03H 9/132; H05K 3/1225; Y10T 29/42
See application file for complete search history.

(56) References Cited

U.S. PATENT DOCUMENTS

2017/0045989 A1* 2/2017 Lee .......................... G06F 3/045
2017/0133582 A1* 5/2017 Hsu ........................ H01L 41/319
2019/0004651 A1* 1/2019 Hong .................... G06F 3/0414

* cited by examiner

*Primary Examiner* — Nelson M Rosario
(74) *Attorney, Agent, or Firm* — ScienBiziP, P.C.

(57) ABSTRACT

A touch sensor with enhanced and small-scale sensitivity includes a substrate, a piezoelectric layer on the substrate, a first electrode layer between the substrate and the piezoelectric layer, a second electrode layer on the piezoelectric layer, and an outer touch layer. The touch layer is made of flexible and deformable material. The touch layer includes a base layer covering the second electrode layer and finely-shaped protrusions protruding from a surface of the base layer away from the piezoelectric layer. The base layer and the protrusions are integrally formed. The disclosure also provides a method for making such touch sensor.

13 Claims, 6 Drawing Sheets

U.S. Pat. No. 10,691,274 B2

TOUCH SENSOR WITH ENHANCED AND SMALL-SCALE SENSITIVITY AND METHOD FOR MAKING SAME

FIELD

The subject matter herein generally relates to touch sensors.

BACKGROUND

Artificial prostheses can go some way towards replacing human limbs. However, current artificial limbs are less likely to achieve tactile sensing. Traditional sensors that implement tactile sensing include piezoelectric sensors, capacitive sensors, resistive sensors, and the like. These sensors recognize a touch by recognizing a pressure generated by the touch, but when the pressure is small, the touch is not recognized.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
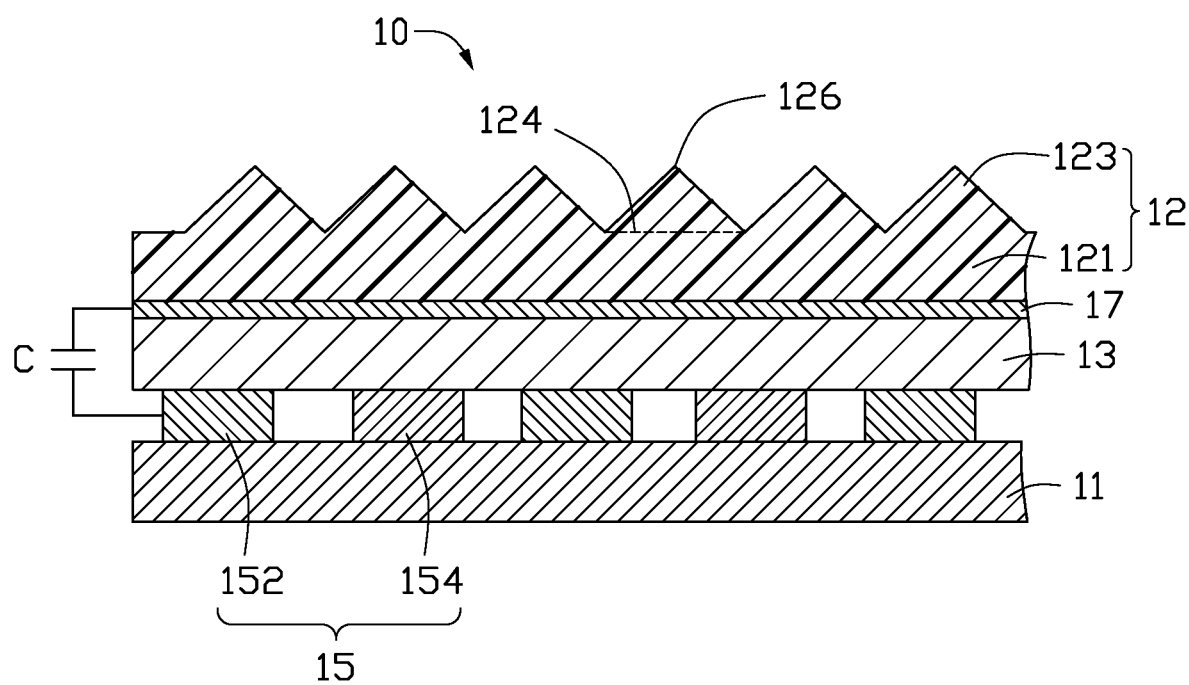
FIG. 1 is a cross-sectional view showing a touch sensor according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Figure 2:
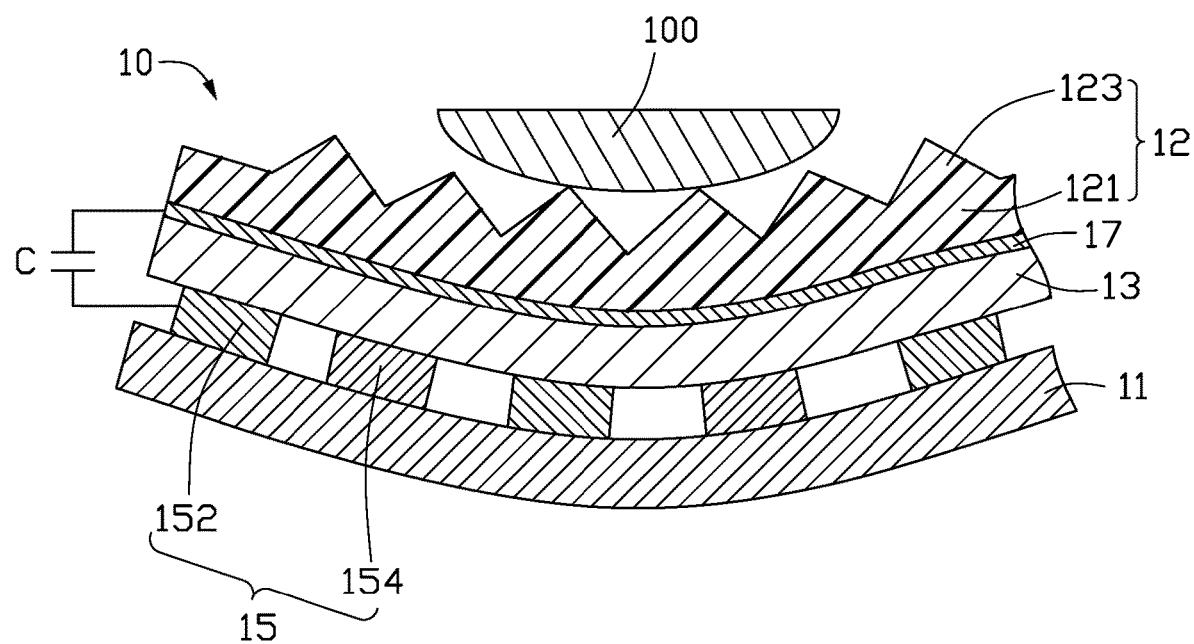
FIG. 2 is a cross-sectional view showing a touch sensor during a touch.

FIGS. 1 and 2 show a touch sensor 10 of an embodiment may be applied to various types of electronic devices or incorporated into an artificial limb. The touch sensor 10 includes a substrate 11, a piezoelectric layer 13 formed on the substrate 11, a first electrode layer 15 formed on a side of the piezoelectric layer 13 adjacent to the substrate 11, and a second electrode layer 17 formed on a side of the piezoelectric layer 13 away from the substrate 11. The first electrode layer 15 is between the substrate 11 and the piezoelectric layer 13, and includes a first electrode 152 and a second electrode 154 which are spaced apart from each other and are electrically insulated from each other. The second electrode layer 17 is a flat electrode layer, which may be a continuous and integrated layer.

As shown in FIGS. 1 and 2, the touch sensor 10 further includes a touch layer 12 on the side of the second electrode layer 17 away from the piezoelectric layer 13, and the touch layer 12 completely covers the second electrode layer 17. The touch layer 12 includes a base layer 121 covering the second electrode layer 17 and protrusions 123 protruding from a surface of the base layer 121 away from the piezoelectric layer 13. In this embodiment, the base layer 121 and the protrusions 123 are made of one material and integrally formed. The touch layer 12 is made of a flexible and deformable material, here a conventional silica gel, such as polydimethylsiloxane (PDMS).

Each protrusion 123 has a first end 124 in conjunction with the base layer 121 and a second end 126 opposite to the first end 124. The second end 126 is away from the base layer 121. The first end 124 is larger than the second end 126. A cross-sectional area of each projection 123 along a direction from the first end 124 to the second end 126 gradually decreases. In an embodiment, the second end 126 is a pointed or sharp end. Each protrusion 123 has a triangular cross section. In an embodiment, each protrusion 123 has a pyramid shape. In this embodiment, the protrusions 123 are adjacent to each other, and two adjacent protrusions 123 are in contact with each other. In an embodiment, the protrusions 123 have a vertical distance from the first end 124 to the second end 126 of 10 to 300 microns, such as 30 microns, and the base layer 121 has a thickness of 50 to 500 microns, such as 100 microns.

Figure 3:
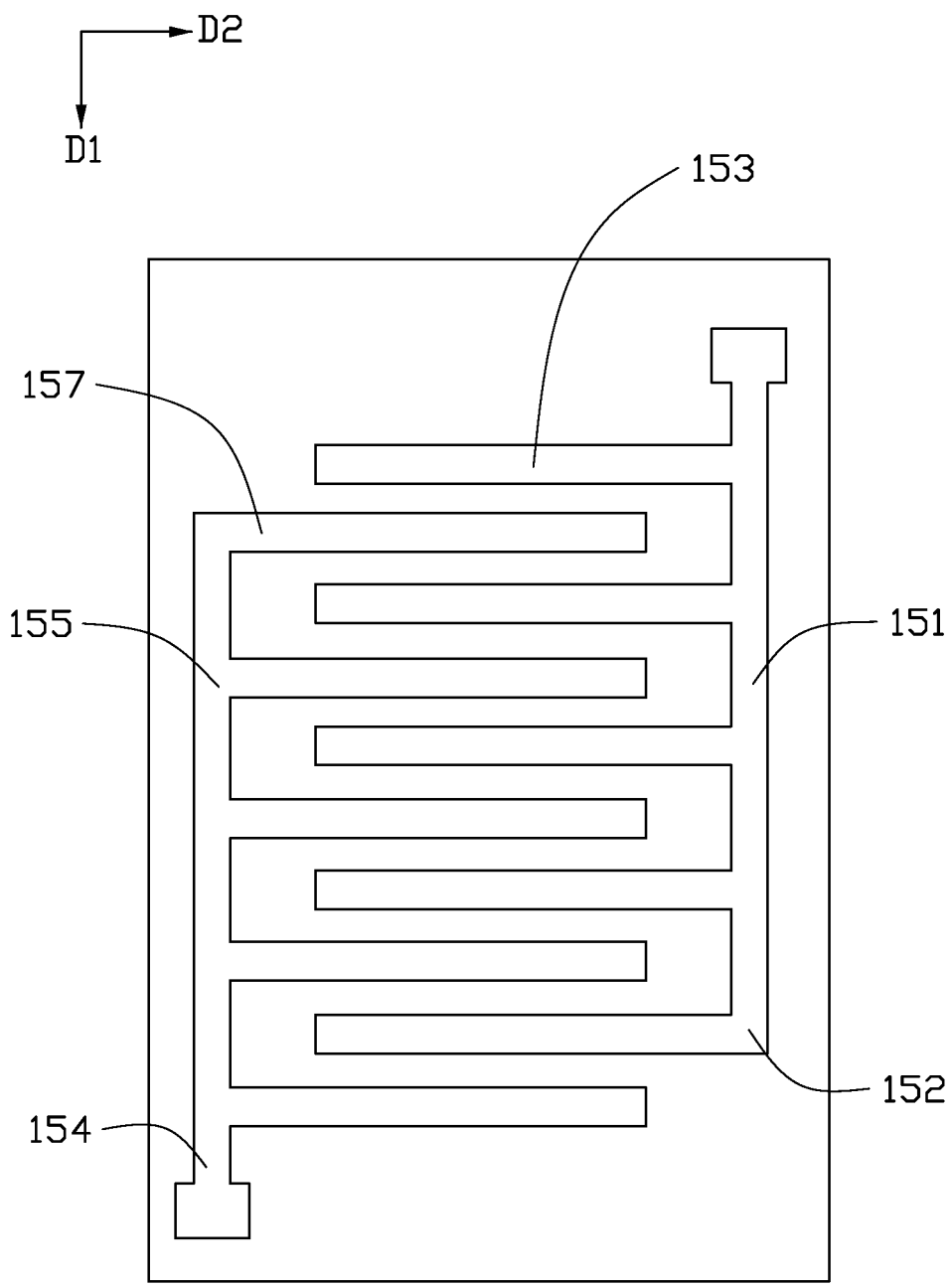
FIG. 3 is a planar view of a first electrode layer of the touch sensor shown in FIG. 1.

FIG. 3 shows the first electrode 152 and the second electrode 154 are both having in comb-like shape and are electrically insulated from each other. The first electrode 152 includes a first connecting portion 151 and first comb tooth portions 153 connected to the first connecting portion 151. The second electrode 154 includes a second connecting portion 155 and second comb tooth portions 157 connected to the second connecting portion 155. The first comb tooth portions 153 are parallel and spaced apart from each other, and the second comb tooth portions 157 are parallel and spaced apart from each other. The first connecting portion 151 and the second connecting portion 155 both extend into a rectangular strip shape in a first direction (direction D1 shown in FIG. 3). The first connecting portion 151 and the second connecting portion 155 are spaced apart from each other. The first comb tooth portions 153 are connected to one side of the first connecting portion 151, for example, the side adjacent to the second connecting portion 155. Each first comb tooth portion 153 extends as a rectangular shape in a second direction (direction D2 shown in FIG. 3) intersecting the first direction D1. The second comb tooth portions 157 are connected to one side of the second connecting portion 155, for example, the side adjacent to the first connecting portion 151. Each second comb tooth portion 157 extends as a rectangular shape in the second direction.

In this embodiment, the first direction D1 is orthogonal to the second direction D2, the first connecting portion 151 is perpendicularly connected to the first comb tooth portions 153, and the second connecting portion 155 is perpendicularly connected to the second comb tooth portions 157. Each first comb tooth portion 153 of the first electrode 152 alternates with one second comb tooth portion 157 of the second electrode 154 in the first direction D1.

As shown in FIG. 2, when the touch sensor 10 is in use, the protrusions 123 of the touch layer 12 make direct contact with a touch object 100. When the touch object 100 touches the touch layer 12 of the touch sensor 10, the touch layer 12 is deformed. Since the base layer 121 and the protrusions 123 are integrally formed with no adhesive layer therebetween, and the protrusions 123 are very small in size with a height of micrometers only, the touch layer 12 has very small scale and very fine stress absorption characteristics, and minute deformations can take place and be recognized. The sensing sensitivity of the touch sensor 10 is enhanced. The protrusion 123 means that the touch sensor 10 and the touch object 100 are in non-planar contact, and tactile sensitivity is improved.

In this embodiment, the substrate 11 is made of a flexible and deformable material, and may be a conventional resin, such as polyimide (PI), or a conventional silica gel, such as PDMS. The substrate 11 has a thickness of 100 to 500 μm.

The piezoelectric layer 13 may be made of various piezoelectric materials, such as polyvinylidene fluoride (PVDF). The piezoelectric layer 13 has a thickness of 20 to 50 μm.

The first electrode layer 15 and the second electrode layer 17 may be made of various conductive materials, such as metallic copper or the like. The first electrode layer 15 and the second electrode layer 17 each have a thickness of 0.5 to 20 μm.

As shown in FIG. 2, the substrate 11 and the touch layer 12 of the touch sensor 10 are all elastically deformable. Because the first electrode layer 15, the piezoelectric layer 13, and the second electrode layer 17 are all thin, the touch sensor 10 as a whole is bendable and deformable. When the touch object 100 touches the protrusions 123 of the touch sensor 10, the touch sensor 10 is deformed and causes deformation of the piezoelectric layer 13. At this time, electrons are generated on both sides of the piezoelectric layer 13, the electrons are concentrated to form a current through an electrode (such as the first electrode 152 or the second electrode 154).

As long as the touch sensor 10 is not pressed, potentials of the first electrode 152 and the second electrode 154 are equal. When the touch sensor 10 is deformed by being pressed, the potentials of the first electrode 152 and the second electrode 154 become unequal. An amount of deformation of the touch sensor 10 can be recorded and measured by voltage-current difference between the first electrode 152 and the second electrode 154. At the same time, the first electrode 152 or the second electrode 154 also cooperates with the piezoelectric layer 13 and the second electrode layer 17 to form a piezoelectric capacitor C. When the touch sensor 10 is deformed by being pressed, a distance between the first electrode layer 15 and the second electrode layer 17 is changed, thus the piezoelectric capacitance C is changed. The deformation of the touch sensor 10 can be converted to indicate extent of change of capacitance. A precise deformation amount of the touch sensor 10 is obtained by conversion of the two indexes, the piezoelectric difference and the capacitance difference.

Sensitivity of touch sensing (S) is equal to $[(\Delta E/E0)*(\Delta C/C0)]/\Delta P$; where E0 is a voltage initially applied to the first electrode 152 or the second electrode 154; $\Delta E$ is an amount of change in the voltage on the first electrode 152 or the second electrode 154, that is, the voltage E on the first electrode 152 or the second electrode 154 after the touch minus E0 (E−E0); C0 is the initial capacitance C, and $\Delta C$ is the amount of change in the capacitance C. That is, during a touch, $\Delta P$ is difference between the before and the after of the touch.

Figure 4:
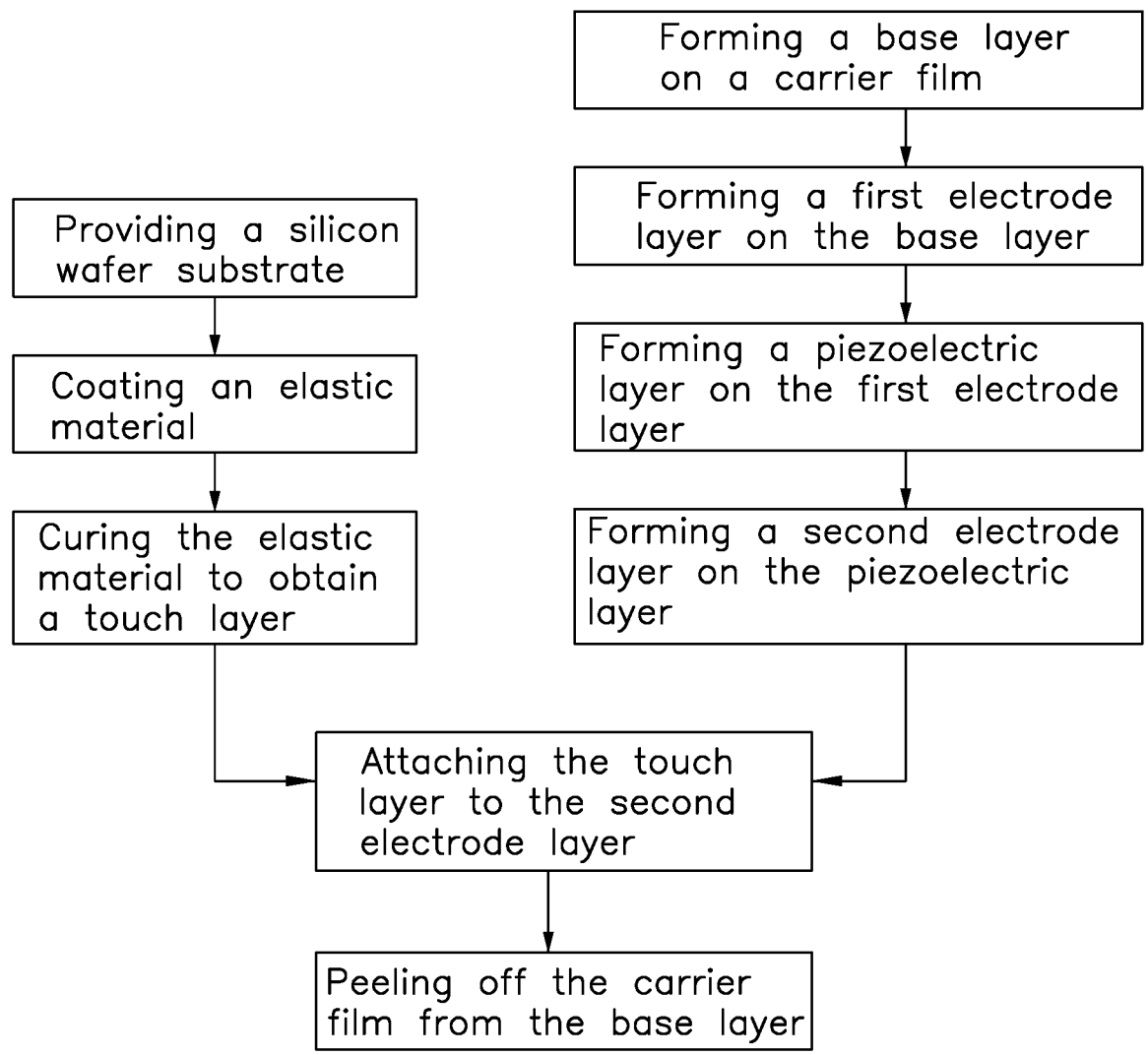
FIG. 4 is a flowchart of a method for making the touch sensor shown in FIG. 1.

FIG. 4 shows a method for making the touch sensor 10 includes the following steps.

Figure 5A:
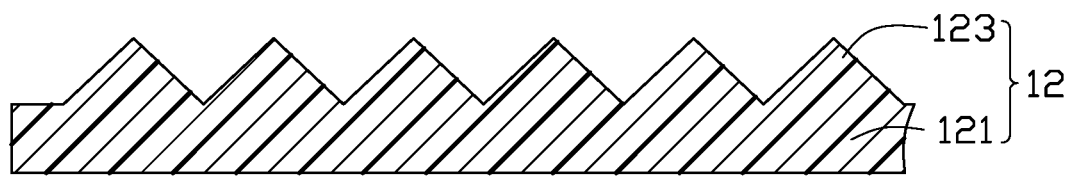
FIGS. 5A through 5C are cross-sectional views showing steps of preparing a touch sensor.

Step S1: As shown in FIG. 5A, providing a touch layer 12.

In an embodiment, the touch layer 12 is made by a method of flipping. The method includes providing a silicon wafer substrate (not shown), and etching the silicon wafer substrate to form grooves. The cross-sectional area of each groove gradually decreases along an inner extension of the silicon wafer substrate. For example, a size of one groove is 30 micrometers×30 micrometers×15 micrometers. Then, a surface of the grooved silicon wafer substrate is coated with an elastic material, for example, a spin coating method is used to form the PDMS. The elastic material fills the grooves and covers the silicon wafer substrate. Then, the elastic material is dried and cured to form the touch layer 12, the elastic material infilling the grooves is dried and cured to form the protrusions 123 of the touch layer 12. The elastic material outside of the grooves is dried to form the base layer 121 of the touch layer 12.

Figure 5B:
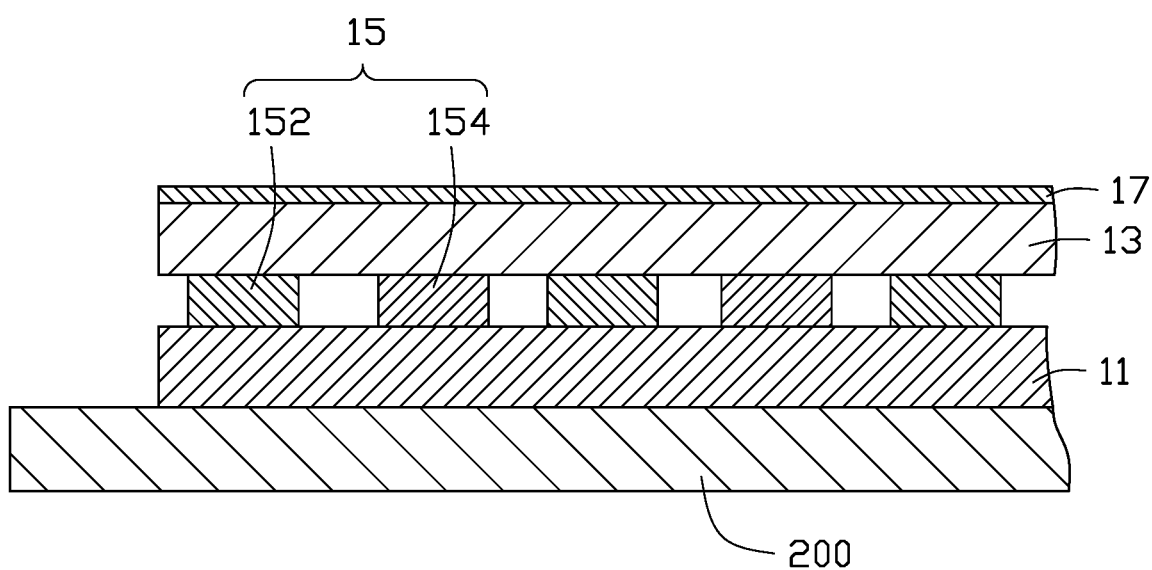

Step S2: As shown in FIG. 5B, forming a substrate 11, a first electrode layer 15, a piezoelectric layer 13, and a second electrode layer 17 sequentially on a carrier film 200.

In an embodiment, the carrier film 200 is made of polyethylene terephthalate (PET).

In an embodiment, the substrate 11 is formed by applying a flexible material, such as PI or PDMS, as a coating onto a surface of the carrier film.

In the embodiment, a patterned conductive layer, such as a patterned metal copper layer, is formed on the surface of the substrate 11 away from the carrier film 200 by screen printing or inkjet printing. The patterned metal conductive layer forms the first electrode layer 15, including the first electrode 152 and the second electrode 154 which are spaced apart, insulated, and comb-shaped.

In an embodiment, a piezoelectric material layer is formed on a surface of the first electrode layer 15 away from the carrier film 200 by slit coating, and the piezoelectric material layer is cured to form the piezoelectric layer 13. The piezoelectric layer 13 may be made of PVDF.

In an embodiment, a conductive foil, such as a copper foil, is laid on the surface of the piezoelectric layer 13. The conductive foil forms the second electrode layer 17.

The step S2 may further include a step of polarizing the piezoelectric layer 13.

Figure 5C:
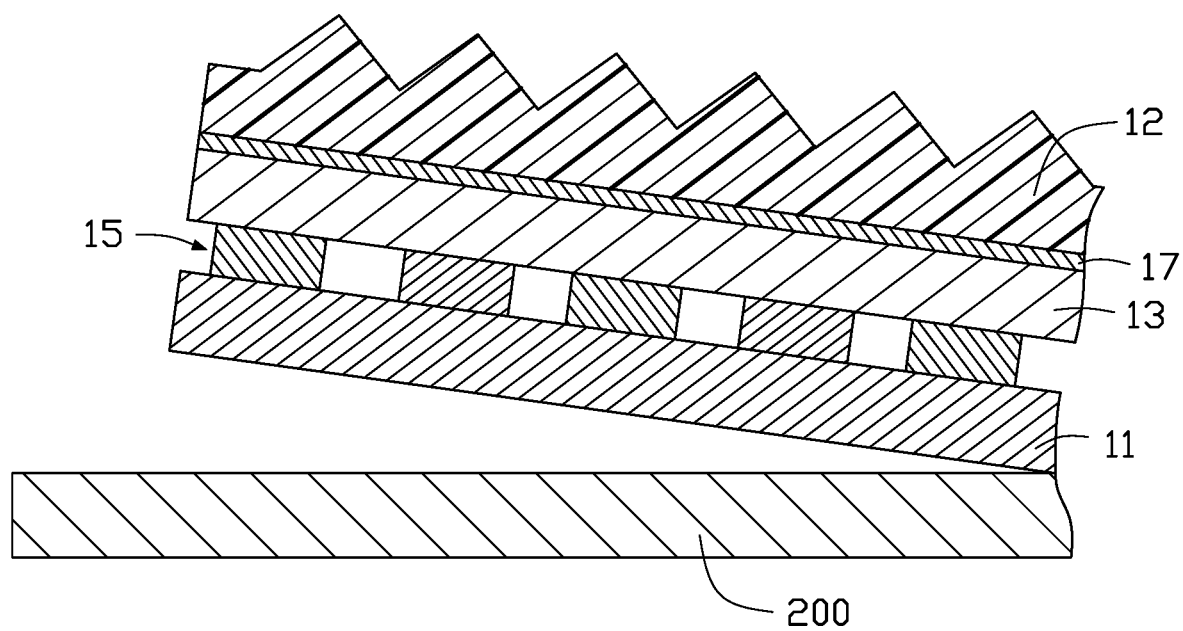

Step S3: As shown in FIG. 5C, attaching the touch layer 12 to the second electrode layer 17, and peeling off the carrier film 200 from the substrate 11.

In an embodiment, the touch layer 12 is attached to a laminate, the laminate including the carrier film 200, the substrate 11, the first electrode layer 15, the piezoelectric layer 13, and the second electrode layer 17. Then, the carrier film 200 is removed.

The step S3 may further include a step of applying a colloid (not shown) to an exposed surface of the piezoelectric layer 13.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A touch sensor, comprising:
   a substrate;
   a piezoelectric layer located on the substrate;
   a first electrode layer located between the substrate and the piezoelectric layer;
   a second electrode layer located on a side of the piezoelectric layer away from the substrate; and
   a touch layer located on a side of the second electrode layer away from the piezoelectric layer, wherein the touch layer being made of a flexible and deformable material, comprising a base layer covering the second electrode layer and a plurality of protrusions protruding from a surface of the base layer away from the piezoelectric layer, and the base layer and the plurality of protrusions are integrally formed;
   wherein the first electrode layer comprises a first electrode and a second electrode, the first electrode and the second electrode are spaced apart from each other and electrically insulated from each other, and each of the first electrode and the second electrode is a comb shaped;
   the first electrode comprises a first connecting portion and a plurality of first comb tooth portions connected to the first connecting portion;
   the second electrode comprises a second connecting portion and a plurality of second comb tooth portions connected to the second connecting portion;
   the first connecting portion is opposite to the second connecting portion and spaced apart from each other;
   the plurality of first comb tooth portions are connected to a side of the first connecting portion adjacent to the second connecting portion;
   the plurality of second comb tooth portions are connected to a side of the second connecting portion adjacent to the first connecting portion; and
   each of the plurality of first comb tooth portions alternates with one of the plurality of second comb tooth portions along a direction in which the first connecting portion and the second connecting portion extend.

2. The touch sensor according to claim 1, wherein each of the plurality of protrusions has a first end in conjunction with the base layer and a second end opposite to the first end; and a cross-sectional area of each of the plurality of protrusions along a direction from the first end to the second end gradually decreases.

3. The touch sensor according to claim 2, wherein the second end is a sharp end.

4. The touch sensor according to claim 2, wherein each of the plurality of protrusions has a pyramid shape, and the plurality of protrusions are adjacent to each other and two adjacent protrusions are in contact with each other.

5. The touch sensor according to claim 1, wherein the second electrode layer is a continuous and integrated layer.

6. The touch sensor according to claim 1, wherein the substrate is made of a flexible and deformable material.

7. The touch sensor according to claim 6, wherein the touch sensor is flexible and deformable.

8. A method of making a touch sensor, comprising:
   preparing a touch layer of a flexible and deformable material, the touch layer comprising a base layer and a plurality of protrusions protruding from a surface of the base layer, the base layer and the plurality of protrusions being integrally formed;
   forming a substrate, a first electrode layer, a piezoelectric layer, and a second electrode layer sequentially on a carrier film; and
   attaching the touch layer to the second electrode layer, and peeling off the carrier film from the substrate;
   wherein preparing the touch layer comprises:
   providing a silicon wafer substrate, and etching the silicon wafer substrate to form a plurality of grooves on a surface of the silicon wafer substrate, and an opening area of each of the plurality of grooves gradually decreases along an inner extension of the silicon wafer substrate;
   coating an elastic material onto a surface of the silicon wafer substrate having the plurality of grooves, and the elastic material filling the plurality of grooves and covering the silicon wafer substrate; and
   drying and curing the elastic material to form the touch layer.

9. The method of making the touch sensor according to claim 8, wherein forming the substrate comprises:
   coating a flexible material onto a surface of the carrier film to form the substrate.

10. The method of making the touch sensor according to claim 8, wherein forming the first electrode layer comprises:
    forming a patterned conductive layer on a surface of the substrate away from the carrier film as the first electrode layer.

11. The method of making the touch sensor according to claim 8, wherein forming the piezoelectric layer comprises:
    forming a piezoelectric material layer on a surface of the first electrode layer away from the carrier film by slit coating, and curing the piezoelectric material layer to form the piezoelectric layer.

12. The method of making the touch sensor according to claim 8, wherein the forming the second electrode layer comprises:
    forming a conductive foil on a surface of the piezoelectric layer away from the first electrode layer as the second electrode layer.

13. The method of making the touch sensor according to claim 8, wherein forming the piezoelectric layer comprises:
    polarizing the piezoelectric layer.

* * * * *